United States Patent
Hoeppel et al.

(10) Patent No.: US 10,312,413 B2
(45) Date of Patent: Jun. 4, 2019

(54) OPTOELECTRONIC SEMICONDUCTOR COMPONENT AND METHOD FOR PRODUCING THE SAME

(71) Applicant: OSRAM Opto Semiconductors GmbH, Regensburg (DE)

(72) Inventors: Lutz Hoeppel, Alteglofsheim (DE); Norwin von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/542,935

(22) PCT Filed: Dec. 1, 2015

(86) PCT No.: PCT/EP2015/078225
§ 371 (c)(1),
(2) Date: Aug. 9, 2018

(87) PCT Pub. No.: WO2016/113032
PCT Pub. Date: Jul. 21, 2016

(65) Prior Publication Data
US 2018/0358512 A1  Dec. 13, 2018

(30) Foreign Application Priority Data
Jan. 15, 2015 (DE) .................. 10 2015 100 578

(51) Int. Cl.
*H01L 33/38* (2010.01)
*H01L 33/48* (2010.01)
*H01L 33/62* (2010.01)

(52) U.S. Cl.
CPC .......... *H01L 33/382* (2013.01); *H01L 33/486* (2013.01); *H01L 33/62* (2013.01);
(Continued)

(58) Field of Classification Search
CPC ..... H01L 33/382; H01L 33/486; H01L 33/62; H01L 2933/0016; H01L 2933/0066
(Continued)

(56) References Cited

U.S. PATENT DOCUMENTS 8,754,429 B2    6/2014   Koizumi
9,000,476 B2    4/2015   Hoeppel
(Continued)

FOREIGN PATENT DOCUMENTS

CN    102959741 A    3/2013
CN    103003941 A    3/2013
(Continued)

OTHER PUBLICATIONS

Notification of Reasons for Refusal based on JP Application No. 2017-537369 (11 pages) dated Jul. 9, 2018 (for reference purpose only).
(Continued)

*Primary Examiner* — Alexander O Williams
(74) *Attorney, Agent, or Firm* — Viering Jentschura & Partner MBB

(57) ABSTRACT

A component with a semiconductor body, a first metal layer and a second metal layer is disclosed. The first metal layer is arranged between the semiconductor body and the second metal layer. The semiconductor body has a first semiconductor layer, a second semiconductor layer, and an active layer. The component has a plated-through hole, which extends through the second semiconductor layer and the active layer for the electrical contacting of the first semiconductor layer. The second metal layer has a first subregion, and a second subregion, spaced apart laterally from the first subregion by an intermediate space. The first subregion is electrically connected to the plated-through hole and is assigned to a first electrical polarity of the component. In
(Continued)

plan view, the first metal layer laterally completely bridges the intermediate space and is assigned to a second electrical polarity of the component which differs from the first electrical polarity.

19 Claims, 2 Drawing Sheets

(52) U.S. Cl.
CPC ............... *H01L 2933/0016* (2013.01); *H01L 2933/0066* (2013.01)

(58) Field of Classification Search
USPC .......................................................... 257/98
See application file for complete search history.

(56) References Cited

U.S. PATENT DOCUMENTS

| | | | |
|---|---|---|---|
| 9,041,033 B2 * | 5/2015 | Akimoto | ............... H01L 33/387 257/701 |
| 9,070,851 B2 * | 6/2015 | Seo | ....................... H01L 27/153 |
| 9,263,655 B2 | 2/2016 | Hoeppel | |
| 9,530,935 B2 | 12/2016 | Neumann | |
| 2010/0171135 A1 | 7/2010 | Engl et al. | |
| 2011/0297987 A1 | 12/2011 | Koizumi | |
| 2012/0074441 A1 | 3/2012 | Seo et al. | |
| 2013/0187192 A1 | 7/2013 | Hoeppel | |
| 2013/0207154 A1 | 8/2013 | Hoeppel | |
| 2014/0001502 A1 | 1/2014 | Akimoto et al. | |
| 2015/0255685 A1 | 9/2015 | Herrmann et al. | |
| 2015/0270446 A1 | 9/2015 | Neumann | |

FOREIGN PATENT DOCUMENTS

| | | |
|---|---|---|
| CN | 103119735 A | 5/2013 |
| CN | 103715345 A | 4/2014 |
| DE | 102007022947 A1 | 10/2008 |
| DE | 102010025320 A1 | 12/2011 |
| DE | 102012106953 A1 | 1/2014 |
| DE | 102012217533 A1 | 3/2014 |
| EP | 2365542 A1 | 9/2011 |
| EP | 2680326 A2 | 1/2014 |
| JP | 2014011275 A | 1/2014 |
| JP | 2015226038 A | 12/2015 |
| WO | 2012039555 A2 | 3/2012 |
| WO | 2014128574 A1 | 8/2014 |

OTHER PUBLICATIONS

International Search Report based on Application No. PCT/EP2015/078225 (4 pages of Search Report and 3 pages of English translation) dated Feb. 1, 2016 (for reference purpose only).

German Search report based on Application No. 10 2015 100 578.6 (8 pages) dated Oct. 28, 2015 (for reference purpose only).

Chinese office action including search report issued for Chinese counterpart application 201580073667, dated Jun. 28, 2018, 8 pages (for reference purpose only).

* cited by examiner

OPTOELECTRONIC SEMICONDUCTOR COMPONENT AND METHOD FOR PRODUCING THE SAME

RELATED APPLICATIONS

The present application is a national stage entry according to 35 U.S.C. § 371 of PCT application No.: PCT/EP2015/078225 filed on Dec. 1, 2015, which claims priority from German application No.: 10 2015 100 578.6 filed on Jan. 15, 2015, and is incorporated herein by reference in its entirety.

TECHNICAL FIELD

A component and a method for producing a component are specified.

BACKGROUND

One object is to specify a component which can be produced in a simplified manner and has high mechanical stability. Furthermore, a cost-effective method for producing such a component is specified.

SUMMARY

According to at least one embodiment of a component, the latter has a semiconductor body having an active layer. In particular, the active layer is a p-n transition zone. The active layer in this case can be configured as one layer, or as a layer sequence of a plurality of layers. During the operation of the component, the active layer emits, for example, electromagnetic radiation, for instance in the visible, ultraviolet or infrared spectral range. Alternatively, the active layer, during the operation of the component, can absorb electromagnetic radiation and convert the latter into electrical signals or electrical energy.

Furthermore, the semiconductor body can have, for example, a first semiconductor layer of a first conductor carrier type and a second semiconductor layer of a second conductor carrier type, wherein the active layer is arranged, for example, between the first semiconductor layer and the second semiconductor layer. In particular, the semiconductor body exclusively has semiconductor layers. The layers of the semiconductor body can be applied in a laminar arrangement to a growth substrate by means of an epitaxy process. The growth substrate can then be removed from the semiconductor body or thinned, such that the component is, for example, devoid of a growth substrate.

The semiconductor body has a first main surface, which is advantageously configured as a radiation passage surface of the component. The radiation passage surface can be structured, as a result of which a radiation coupling-out or radiation coupling-in efficiency is increased. In particular, the first main surface of the semiconductor body is formed by a surface of the first semiconductor layer. The semiconductor body has a second main surface, which is averted from the first main surface and is formed, for example, by a surface of the second semiconductor layer. In particular, the first main surface and the second main surface delimit the semiconductor body in a vertical direction.

A vertical direction is understood to mean a direction which is oriented transversely, in particular perpendicularly to a main plane of extent of the active layer. For example, the vertical direction is perpendicular to the first and/or the second main surface of the semiconductor body. Conversely, a lateral direction is understood to mean a direction which runs along, in particular parallel to the main plane of extent of the active layer. The vertical direction and the lateral direction are advantageously arranged perpendicular to one another.

According to at least one embodiment of the component, the semiconductor body has at least one recess. The recess extends in particular from the second main surface, through the second semiconductor layer and the active layer into the first semiconductor layer. A recess is understood to mean an opening in the semiconductor body which in particular does not have a continuous form through the semiconductor body. In other words, the recess forms a blind hole in the semiconductor body which, in the lateral direction, is enclosed by the semiconductor body, for example over its full perimeter. The semiconductor body can have a plurality of such recesses. For the configuration of a plated-through hole for electrically contacting the first semiconductor layer from the side of the second main surface, the recess can be filled with an electrically conductive material. The component can have a plurality of such plated-through holes.

According to at least one embodiment of the component, the latter has a first metal layer. The first metal layer is arranged, for example, on a side of the semiconductor body facing towards the second main surface. The first metal layer can have one or a plurality of openings. In particular, the plated-through hole extends through the opening in the first metal layer in the vertical direction. In plan view onto the semiconductor body, the first metal layer and the plated-through hole or plated-through holes are in particular devoid of overlaps. The first metal layer covers the semiconductor body or the active layer, for example, only in certain regions. By way of example, the first metal layer is a galvanically deposited metal layer.

According to at least one embodiment of the component, the latter has a second metal layer. The first metal layer is arranged between the semiconductor body and the second metal layer at least in certain regions. The second metal layer advantageously has a first subregion, and a second subregion, spaced apart laterally from the first subregion. In particular, the first subregion is electrically connected to the plated-through hole for electrically contacting the first semiconductor layer. By way of example, the first subregion in this case is electrically insulated from the first metal layer.

The first subregion of the second metal layer is assigned to a first electrical polarity of the component. In particular, the first metal layer is assigned to a second electrical polarity of the component which differs from the first electrical polarity. During the operation of the component, the first metal layer and the first subregion of the second metal layer therefore have different polarities. By way of example, the first metal layer is provided for contacting the component on the p side and the first subregion of the second metal layer is provided for contacting the component on the n side. The second subregion of the second metal layer can be electrically connected to the first metal layer and is therefore in particular assigned to the second electrical polarity of the component. By way of example, the second subregion directly adjoins the first metal layer in certain regions. The second subregion can be electrically connected to the second semiconductor layer via the first metal layer.

In plan view onto the semiconductor body, the first metal layer and the second subregion, in combination, cover, for example, at least 90%, advantageously at least 95%, of the total surface area of the active layer. The first metal layer and the second metal layer, in combination, can cover the entire active layer completely.

According to at least one embodiment of the component, the latter, in the lateral direction, has an intermediate space between the first subregion and the second subregion of the second metal layer. In plan view, the intermediate space is bridged at least partially, advantageously completely, by the first metal layer. In the lateral direction, the second metal layer can project beyond the first metal layer. By way of example, the active layer or the entire semiconductor body has no point which is not mechanically supported by the first metal layer or by the second metal layer.

In at least one embodiment of a component, the latter has a semiconductor body, a first metal layer and a second metal layer, wherein the first metal layer is arranged between the semiconductor body and the second metal layer. The semiconductor body has a first semiconductor layer on a side which is averted from the first metal layer, a second semiconductor layer on a side facing towards the first metal layer, and an active layer arranged between the first semiconductor layer and the second semiconductor layer. The component has a plated-through hole, which in particular extends in a vertical direction through the second semiconductor layer and the active layer for the electrical contacting of the first semiconductor layer. The second metal layer has a first subregion, and a second subregion, spaced apart laterally from the first subregion by an intermediate space, wherein the first subregion is electrically connected to the plated-through hole. In plan view, the first metal layer laterally completely bridges the intermediate space. In this case, the first subregion of the second metal layer is assigned to a first electrical polarity of the component, and the first metal layer is assigned to a second electrical polarity of the component which differs from the first electrical polarity.

In particular, laterally complete bridging of the intermediate space implies that the first subregion and the second subregion, at points of the intermediate space at least along a lateral direction, are completely bridged by the first metal layer. In particular, in plan view, the first metal layer covers at least 60%, for instance at least 80% or at least 90%, for instance about 95%, of the entire intermediate space.

Advantageously, the entire intermediate space is devoid of a point which is not covered by the first metal layer and/or by the second metal layer. The laterally complete bridging or coverage of the intermediate space by the first metal layer has a mechanically stabilizing effect on the component, such that possible mechanical weak points, in particular at points of the intermediate space, are largely or entirely prevented. The first metal layer can in this case be configured as a mechanically stabilizing, advantageously as a self-supporting, layer of the component. In other words, the first metal layer can be configured as an independent layer, which, even without the mechanical support of further layers, is mechanically stable in response to its own weight.

The first metal layer in this case can have a continuous form. By way of example, the first metal layer, in the vertical direction, has a thickness of between 5 μm and 50 μm inclusive. The thickness of the first metal layer is advantageously between 5 μm and 30 μm inclusive, for instance between 5 μm and 15 μm inclusive. Such a configuration of the first metal layer ensures a sufficient mechanical stability of the component, even at points of the intermediate space.

The second metal layer can be configured as a mechanically stabilizing layer of the component. In particular, the second metal layer, in comparison with the first metal layer, has a greater thickness. By way of example, the thickness of the second metal layer is between 10 μm and 200 μm inclusive, for instance between 10 μm and 100 μm, in particular between 50 μm and 100 μm inclusive. In particular, the thickness of the second metal layer is at least two times, for instance four times or ten times greater than the thickness of the first metal layer. By way of example, the ratio of the thickness of the second metal layer to the thickness of the first metal layer is between 2 and 10 inclusive, for instance between 5 and 10 inclusive.

On account of the lateral, in particular complete, coverage of the active layer, no region of the active layer of the component is left without mechanical support by the first or second metal layer. As a result, a higher output is achieved during the production of the component. In particular, damage to components, resulting for example from mechanical loading during singulation, is avoided. Moreover, during further processing steps, for instance during the removal of the growth substrate, in particular by an etching or a laser lift-off method, during soldering, structuring, transporting or fitting, the robustness of the components is significantly improved.

According to at least one embodiment of the component, the second metal layer is laterally delimited by a molding, for instance by an electrically insulating potting compound. The first subregion and the second subregion are advantageously embedded in the molding. By way of example, the first subregion and the second subregion respectively adjoin the molding on all sides in the lateral direction. The molding can be configured in one piece, i.e. continuously. The intermediate space is at least partially, in particular completely, filled by a material of the molding. The laterally spaced-apart subregions of the second metal layer can therefore be held together by the molding, and therefore form, together with the molding, a particularly mechanically stable carrier of the component.

According to at least one configuration of the component, the first metal layer and/or the second metal layer are a galvanically deposited metal layer. In particular, the metal layers include a metal, such as nickel, copper or other metals. As galvanically deposited metal layers, the first metal layer and the second metal layer may each include a first metal and at least one further material. The proportion of the first metal is in particular at least 90 atomic percent, for instance at least 95 or 98 atomic percent, of the first and/or the second metal layer. By way of example, the metal layers, in respect of their materials, are configured in such a way that the first metal layer has a higher modulus of elasticity than the second metal layer and/or the second metal layer has a higher thermal conductivity than the first metal layer. By way of example, the first metal layer includes nickel and the second metal layer includes copper. Such a configuration of the metal layers reduces the overall height of the component, whilst maintaining sufficient mechanical stability of the component and a high efficiency of heat dissipation by the second metal layer.

According to at least one embodiment of the component, the latter has an electrically conductive layer, which is arranged between the first metal layer and the second metal layer. In particular, the electrically conductive layer is formed as a mirror layer and in this case may include a metal. In plan view, the electrically conductive layer in this case covers the active layer at least in certain regions. Along the vertical direction, the electrically conductive layer can extend laterally with respect to the second semiconductor layer to such an extent that it laterally encloses the second semiconductor layer or the active layer. Electromagnetic radiation which emerges laterally or rearwards from the semiconductor body can therefore be reflected r again in the direction of the active layer or in the direction of the radiation passage surface of the component, thereby increasing the efficiency of the component. The electrically conductive layer can be configured in particular as a metal layer stack having a radiation-reflecting mirror layer.

The electrically conductive layer can have a first sublayer, and a second sublayer, spaced apart laterally from the first sublayer, wherein the first sublayer is electrically connected, for example, to the first subregion of the second metal layer, and the second sublayer is electrically connected to the second subregion of the second metal layer. In particular, the sublayers of the electrically conductive layer are likewise spaced apart from one another laterally by the intermediate space between the subregions of the second metal layer. By way of example, a trench of the electrically conductive layer is formed in the region of the intermediate space, such that the electrically conductive layer is subdivided into two sublayers separated from one another on account of the trench. By way of example, during a galvanic coating process, the electrically conductive layer serves as a seed layer for the second metal layer to be applied. The first subregion of the second metal layer can adjoin the first sublayer of the electrically conductive layer, and the second subregion can adjoin the second sublayer.

By way of example, the first subregion of the second metal layer is electrically connected to the plated-through hole via the first sublayer of the electrically conductive layer. The first subregion can adjoin the first sublayer, it being possible for the first sublayer to likewise adjoin the plated-through hole. In plan view, the plated-through hole overlaps in particular with the first subregion of the second metal layer. In this case, the plated-through hole can extend in the vertical direction from the first sublayer of the electrically conductive layer, through the first metal layer, the second semiconductor layer and the active layer, into the first semiconductor layer, as a result of which it is possible, during the electrical contacting of the first semiconductor layer, to dispense with a complex redistribution wiring plane between the semiconductor body and the carrier of the component.

According to at least one embodiment of the component, the latter has an insulating layer, which is arranged at least in certain regions between the first metal layer and the second metal layer. For electrical insulation, the insulating layer is arranged, for example, continuously between the first metal layer and the first subregion of the second metal layer. The insulating layer can have a first opening or a plurality of first openings, the plated-through hole extending through the first opening. In the lateral direction, the plated-through hole is enclosed in particular by the insulating layer, such that an electrical short circuit between the plated-through hole and the first metal layer or the second semiconductor layer or the active layer is prevented. The insulating layer in this case can cover inner walls of the recess completely. Here, the insulating layer can extend in certain regions through the first metal layer. In particular in the region of the recess, the insulating layer and the first metal layer have a common opening, the plated-through hole extending, for example, from the electrically conductive layer through the common opening to the first semiconductor layer.

The insulating layer can moreover have a second opening or a plurality of second openings, it being possible for the second subregion of the second metal layer to extend through the second opening for the electrical contacting of the first metal layer. The second subregion can in this case adjoin the first metal layer in the second opening. It is also possible for the electrically conductive layer, for instance a radiation-reflecting, metal-containing layer, to be arranged in the second opening between the first metal layer and the second subregion of the second metal layer.

According to at least one embodiment of the component, a current distribution layer is arranged between the semiconductor body and the first metal layer. The current distribution layer has an electrically conductive configuration and, for example, adjoins the first metal layer in certain regions.

According to at least one embodiment of the component, an electrically conductive connecting layer is arranged between the semiconductor body and the first metal layer. In particular, the connecting layer is configured for the reflection of radiation. In particular, the connecting layer adjoins the semiconductor body, for instance the second semiconductor layer. In this case, the connecting layer can be electrically connected to the second subregion of the second metal layer via the first metal layer. The second semiconductor layer is therefore externally electrically contactable in particular via the connecting layer, the current distribution layer, the first metal layer and the second subregion.

According to at least one embodiment of the component, the latter has a diffusion barrier layer, which is arranged, for example, between the connecting layer and the current distribution layer. The diffusion barrier layer makes it possible to prevent metal atoms or metal ions from migrating from the current distribution layer or the metal layers into the connecting layer, into the semiconductor body and therefore into the active layer, and damaging the latter.

According to at least one embodiment of the component, the latter has a passivation layer, which is arranged between the first metal layer and the semiconductor body. The passivation layer can have one or a plurality of openings, through which the first metal layer extends, for instance to the current distribution layer or to the connecting layer. In plan view, the current distribution layer can cover the opening or the plurality of openings of the passivation layer completely. In particular, the passivation layer surrounds the connecting layer, the diffusion barrier layer and the current distribution layer in the lateral direction. In this case, the passivation layer extends in a vertical direction, for example, from the first metal layer up to the semiconductor body, and in particular adjoins the insulating layer. In a vertical direction, the first metal layer is arranged for instance between the passivation layer and the insulating layer. With respect to the first metal layer, the connecting layer, the diffusion barrier layer and the current distribution layer, the passivation layer can serve in certain regions as an encapsulation layer. However, the passivation layer can be configured as part of the insulating layer, or can be optional.

According to at least one embodiment of the component, the latter is configured so as to be electrically contactable via the first subregion and the second subregion of the second metal layer, on its reverse side. In other words, the component, via a reverse side thereof which is averted from the radiation passage surface, can be electrically contactable with an external voltage source. The radiation passage surface is thus in particular devoid of electrical contacts or conductor tracks.

In one embodiment of a method for producing one or a plurality of the above-described components, a semiconductor body is provided, for example grown on epitaxially. A first metal layer is formed on the semiconductor body, for instance by means of a galvanic deposition process. In this case, the first metal layer can be deposited galvanically on an electrically conductive seed layer, which in particular is formed on a side of a passivation layer which is averted from the semiconductor body. Furthermore, an electrically conductive layer, in particular a metal-containing mirror layer, can be formed on a side of the first metal layer which is averted from the semiconductor body. Beforehand, it is possible for an insulating layer to be formed at least for partial electrical insulation between the electrically conductive layer and the first metal layer. The second metal layer is applied galvanically, for example, to the electrically conductive layer.

The electrically conductive layer can in this case be electrically connected to the plated-through hole in certain regions. In particular, the conductive layer has a first sublayer, and a second sublayer, spaced apart laterally from the first sublayer, wherein, for example, the first sublayer is electrically connected to the plated-through hole. The second sublayer can be electrically connected to the first metal layer. In particular, a first subregion and a second subregion of the second metal layer which is spaced apart laterally from the first subregion by an intermediate space can be applied galvanically to the first sublayer or to the second sublayer. In plan view, the intermediate space is bridged in particular by the first metal layer, and is therefore covered completely at least along a lateral direction. In particular, in plan view, the first metal layer can cover the intermediate space completely. The first subregion is in this case electrically connected to the plated-through hole in particular via the first sublayer. The second subregion can be electrically connected to the first metal layer, for instance directly or via the second sublayer.

According to at least one embodiment of the method, the second metal layer is potted with an electrically insulating potting compound. The first subregion and the second subregion are in this case advantageously embedded in the potting compound, such that they are enclosed on all sides by the potting compound at least in the lateral direction. The intermediate space between the first and the second subregion is filled at least partially, advantageously completely, by a material of the potting compound.

The method is particularly suitable for producing an above-described component. Consequently, the features described in conjunction with the component can also be considered with respect to the method, and vice versa.

BRIEF DESCRIPTION OF THE DRAWING(S)

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
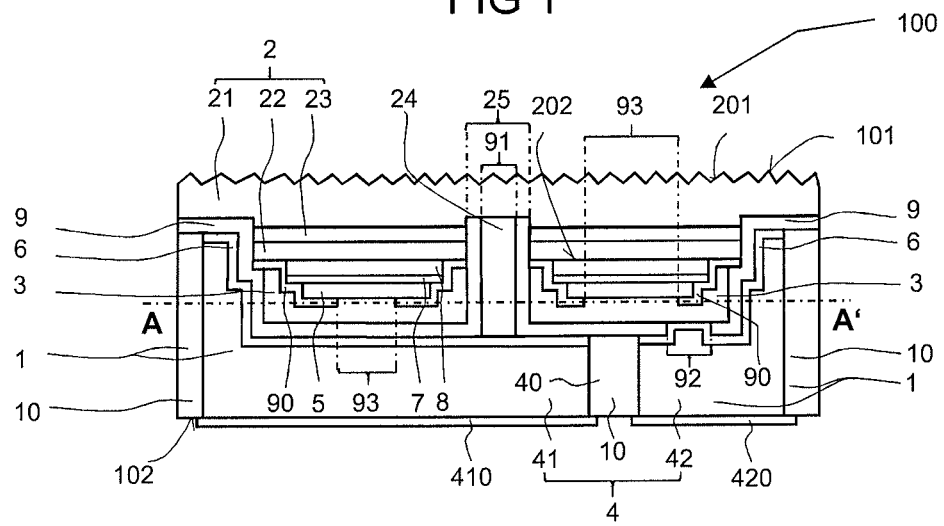
FIG. 1 shows a schematic illustration of an embodiment for a component.

A first embodiment for a component is shown schematically in FIG. 1. The component 100 has a carrier 1, and a semiconductor body 2 arranged on the carrier. The semiconductor body 2 has a first semiconductor layer 21, a second semiconductor layer 22, and an active layer 23 arranged between the first and the second semiconductor layer. The first semiconductor layer 21, the second semiconductor layer 22 and the active layer 23 can respectively have one or a plurality of doped or undoped layers. The active layer 23 is in particular a p-n transition zone of the semiconductor body. In particular, the semiconductor body includes a III-V or a II-VI semiconductor material, or consists thereof. By way of example, the first semiconductor layer and/or the second semiconductor layer have a GaN, a GaP or a GaAs layer. These layers may additionally include aluminum and/or indium and are configured, for instance, as an AlGaN, InAlGaN or InAlGaP layer. The first semiconductor layer 21 and the second semiconductor layer 22 can, for example, be configured as an n-type and p-type conductor respectively, or vice versa. By way of example, the second semiconductor layer 22 is configured as a p-type conductor. The component 100 is in particular devoid of a growth substrate.

The component has a radiation passage surface 101 and a reverse side 102 which is averted from the radiation passage surface. The radiation passage surface 101 has a structured configuration. In particular, the radiation passage surface 101 is formed by a first main surface 201 of the semiconductor body 2, for instance by a surface of the first semiconductor layer 21. It is also possible for the radiation passage surface 101 to be formed by a surface of a radiation-permeable layer which is arranged on the first semiconductor layer 21. In particular, the component 100 is externally electrically contactable via the reverse side 102. The component 100 can thus be configured as a surface-mountable component.

In FIG. 1, a connecting layer 8, a diffusion barrier layer 7, a current distribution layer 5, a passivation layer 90, a first metal layer 3, an insulating layer 9 and an electrically conductive layer 6 are arranged in the sequence indicated, at least in places, between the semiconductor body 2 and the carrier 1. In principle, it is possible to dispense with the current distribution layer 5.

The carrier 1 has a second metal layer 4. The second metal layer includes a first subregion 41 and a second subregion 42, which is spaced apart laterally from the first subregion 41. An intermediate space 40 is formed between the first subregion 41 and the second subregion 42, such that the first subregion 41 is electrically isolated from the second subregion 42.

The carrier 1 furthermore includes a molding 10. The molding 10 is in particular configured as an electrical insulator. By way of example, the molding 10 is configured as a potting compound. The second metal layer 4, with the first subregion 41 and the second subregion 42, is enclosed by the molding 10, in particular laterally over its full perimeter. The first subregion 41 and the second subregion 42 in this case adjoin the molding 10, in particular in lateral directions. The intermediate space 40 is filled completely, for example, with an electrically insulating material of the molding. The subregions 41 and 42 of the second metal layer 4 are in particular held together in a mechanically stable manner by the molding 10. In the lateral direction, the second metal layer 4 does not extend, for example, to the edge of the component 100, and, in lateral directions, is embedded in particular completely in the molding 10. In the lateral direction, the molding 10 terminates, for example, with the first semiconductor layer 21 of the semiconductor body 2. Such a configuration of the molding 10 increases the mechanical integrity of the second metal layer 4 and therefore the stability of the component 100.

The first metal layer 3 is arranged between the semiconductor body 2 and the second metal layer 4. In plan view, the first metal layer 3 bridges the intermediate space 40 completely, at least along a lateral direction. In particular, the first metal layer 3 bridges at least 60%, for instance at least 80% or at least 90%, for instance approximately 95%, of the entire intermediate space 40. In particular, the first metal layer 3 is configured as a mechanically stabilizing layer of the component. The first metal layer 3 in this case has a vertical thickness of at least 5 µm, in particular at least 10 µm. By way of example, the thickness of the first metal layer 3 is between 5 µm and 50 µm inclusive, for instance between 5 µm and 30 µm or between 10 µm and 20 µm. On account of the at least laterally complete coverage of the intermediate space 40 by the first metal layer 3, the component is devoid of mechanical weak points in the regions of the intermediate space 40. In particular, the first metal layer 3 has a continuous form. In plan view, the semiconductor body 2 covers the first metal layer 3, in particular completely. In lateral directions, the first metal layer 3 is enclosed by the insulating layer 9.

The second metal layer 4 can be configured as a mechanically stabilizing layer of the component 100. In particular, the second metal layer 4, for instance in the regions of overlap with the first metal layer 3, has a vertical thickness which, for example, is at least the same size as, advantageously at least two times, for instance four times or ten times the size of, the thickness of the first metal layer 3. In plan view, the first metal layer 3 and the second metal layer 4 together advantageously cover the active layer 23 completely. By means of a complete coverage of the active layer 23, in particular no region of the active layer 23 remains devoid of mechanical support provided by the mechanically stabilizing metal layers 3 and 4, such that the component 100 has a particularly mechanically stable configuration.

The first metal layer 3 and the second metal layer 4 can each be a galvanically deposited metal layer. They may include the same metal, for instance nickel or copper. In particular, they may also include different materials. By way of example, the first metal layer 3 has a higher modulus of elasticity than the second metal layer 4. By way of example, the second metal layer 4 has a higher thermal conductivity than the first metal layer 3. By way of example, the first metal layer 3 includes nickel, and the second metal layer 4 includes copper.

The insulating layer 9 is arranged between the first metal layer 3 and the second metal layer 4. By means of the insulating layer 9, the first metal layer 3 is electrically insulated from the first subregion 41 of the second metal layer 4. The insulating layer 9 in this case can have a continuous form. It is possible for a bonding layer (not shown) to be arranged between the first metal layer 3 and the insulating layer 9. This bonding layer can be applied to the first metal layer 3 by means of a coating process, for instance by means of vapor deposition. In particular, the bonding layer includes titanium or chromium. By means of the bonding layer, a high mechanical stability can be achieved between the bonding layer and the insulating layer 9.

The insulating layer 9 and the first metal layer 3 have a common opening 91, through which the plated-through hole 24 extends. Moreover, the insulating layer 9 has at least a second opening 92, through which the second subregion 42 of the second metal layer 4 extends to the first metal layer 3.

In particular, the second metal layer 4 is a metal layer deposited galvanically on the insulating layer 9. Prior to the application of the second metal layer 4, an electrically conductive layer 6 can be applied to the insulating layer 9. In the region of the second opening 92, the first metal layer 3 and the electrically conductive layer 6 are in direct electrical contact, for example. This electrically conductive layer 6 can then be structured, such that the intermediate space 40 is devoid of the electrically conductive layer 6, for example. The electrically conductive layer 6 serves in particular as a seed layer for the second metal layer 4 with the subregions 41 and 42, for example during a galvanic coating process.

The electrically conductive layer 6 is advantageously configured as a mirror layer. By way of example, it includes a metal, for instance aluminum, rhodium, palladium, silver or gold. During the operation of the component 100, the electrically conductive layer 6 reflects electromagnetic radiation in the direction of the radiation passage surface 101. In particular, the electrically conductive layer 6 reflects at least 60%, advantageously at least 80%, particularly advantageously at least 90%, of an impinging proportion of the spectrum of the radiation generated by the active layer 23 during the operation of the component. In FIG. 1, the electrically conductive layer 6 extends in the lateral direction beyond the second semiconductor layer 22 and the active layer 23. In the lateral direction, it is delimited in particular by the second metal layer 4 or the molding 10, and in particular surrounded over its full perimeter. The electrically conductive layer 6 can thus be protected against environmental influences, such as humidity or oxygen.

The diffusion barrier layer 7 is arranged between the semiconductor body 2 and the current distribution layer 5. This layer in particular prevents the migration of metal atoms or metal ions from the current distribution layer 5, the electrically conductive layer 6, the first metal layer 3 or from the second metal layer 4 into the connecting layer 8 and therefore into the active layer 23, thus preventing any damage thereto.

The connecting layer 8 is arranged between the semiconductor body 2 and the diffusion barrier layer 7, wherein the connecting layer 8 is electrically conductive, and is advantageously configured for the reflection of radiation, e.g. is made of Ag, Al, Pd, Rh, Au, ITO, ZnO. In a plan view onto the semiconductor body 2, the electrically conductive layer 6 and the connecting layer 8 together cover the active layer 23, for example completely. Such a configuration of the electrically conductive layer 6 and the connecting layer 8 increases the radiation coupling-out efficiency of the component 100.

The component has a passivation layer 90, which encloses the connecting layer 8, the diffusion barrier layer 7 and the current distribution layer 5 in lateral directions, in particular over their full perimeter. The electrically conductive layer 6 and the insulating layer 9 have a step at the edge of the component and are configured in such a way that the second semiconductor layer 22 and the active layer 23 are enclosed in certain regions by the insulating layer 9 or by the electrically conductive layer 6. Radiation emerging laterally with respect to the reverse side 102 of the component 100 can thus be reflected back by the electrically conductive layer 6 in the direction of the radiation passage surface 101. In this case, the insulating layer 9 is configured to be permeable for instance to the radiation generated during the operation of the component 100.

The semiconductor body 2 has a recess 25. The recess 25 extends from the second main surface 202 of the semiconductor body 2, through the second semiconductor layer 22 and the active layer 23, into the first semiconductor layer 21. A plated-through hole 24 is formed in the recess 25. In this case, the plated-through hole 24, in the lateral direction, is in particular enclosed by the insulating layer 9 over its full perimeter. The plated-through hole 24 includes an electrically conductive material, for instance a metal. The plated-through hole 24 is electrically connected to the first subregion 41 of the second metal layer 4 via the electrically conductive layer 6. The plated-through hole 24 and the electrically conductive layer 6 may include the same electrically conductive material or different materials. The plated-through hole 24 is in particular in direct electrical contact with the electrically conductive layer 6. It is also possible for the component 100 to have a plurality of plated-through holes 24 for the electrical contacting of the first semiconductor layer 21, as a result of which a particularly uniform current distribution is achieved within the first semiconductor layer 21.

The component 100 is configured so as to be electrically contactable via the reverse side 102, i.e. on the reverse side. The component 100 can thus be electrically connected via the first subregion 41 and the second subregion 42 to an external voltage source. The semiconductor body 2 in this case covers the first and second subregions 41 and 42 of the second metal layer 4, in particular completely. In FIG. 1, the component 100, on the reverse side 102, has a first contact layer 410, which is in direct electrical contact with the first subregion 41, and a second contact layer 420, which is in direct electrical contact with the second subregion 42 of the second metal layer 4. In a plan view onto the carrier 1, the semiconductor body 2 covers the first and the second contact layer 410 and 420, in particular completely. In a plan view onto the semiconductor body 2, the contact layers 410 and 420 cover the first subregion 41 or the second subregion 42, for example completely, or in particular project beyond said subregions 41 and 42 respectively. The first contact layer 410 is in particular configured as an n-type contact layer, and the second contact layer 420, for instance, is configured as a p-type contact layer.

Figure 2:
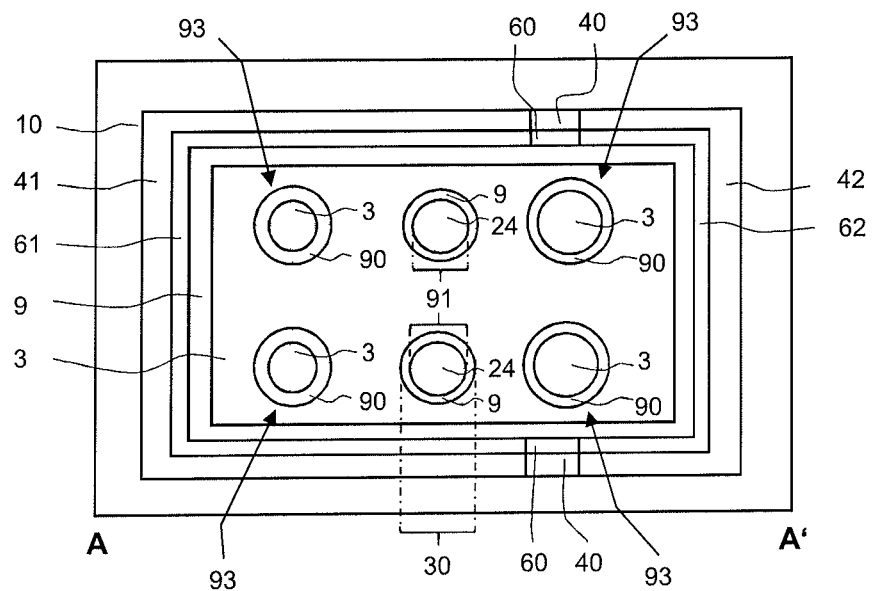
FIG. 2 shows a schematic illustration of a lateral section of the embodiment for a component.

FIG. 2 shows a lateral section of the component 100 along a line AA' denoted in FIG. 1.

The component 100 has openings 91 common to the first metal layer 3 and the insulating layer 9, through which the plated-through hole 24 extends for the electrical contacting of the first semiconductor layer 21. Two such common openings are shown in FIG. 2. In a manner which deviates therefrom, the component 100 can have merely one or more than two such openings 91. In this case, the first metal layer 3 has an opening 30, in which the insulating layer 9 is arranged for electrical insulation between the plated-through hole 24 and the first metal layer 3. In the common opening 91, the plated-through hole 24 is therefore enclosed over its full perimeter by the insulating layer 9 in the lateral direction.

In the vertical direction, the plated-through hole 24 extends from the electrically conductive layer 6, which is formed in particular as a mirror layer, through the opening of the first metal layer 3, in particular through the common opening 91, to the first semiconductor layer 21. The electrically conductive layer 6 has a first sublayer 61, and a second sublayer 62, which is spaced apart laterally and electrically insulated from the first sublayer 61. In particular, the sublayers 61 and 62 are spatially separated from one another by a trench 60 in the region of the intermediate space 40. The trench 60 can be filled by an electrically insulating material, for instance by a material of the molding 10. By way of example, the first subregion 41 of the second metal layer 4 is directly electrically connected to the plated-through hole 24 via the first sublayer 61. The first subregion 41, the first sublayer 61 and the plated-through hole 24 are therefore assigned to a first, for instance n-side, polarity of the component 100.

In FIG. 2, the passivation layer 90 has a plurality of openings 93, through which the first metal layer 3 extends for the electrical contacting of the second semiconductor layer 22. The first metal layer 3 is in particular electrically connected to the second subregion 42 of the second metal layer 4. In this case, the second subregion 42 can adjoin the first metal layer and the second sublayer 62 of the electrically conductive layer 6 in the opening 93 of the passivation layer 90. It is also possible for the second sublayer 62 to be arranged, in the vertical direction, between the first metal layer 3 and the second subregion 42. The second subregion 42, the second sublayer 62 and the first metal layer 3 are therefore assigned to a second, for instance p-side, polarity of the component 100 which differs from the first polarity.

In the case of the vertical height denoted by AA', the first metal layer 3 is enclosed in the lateral direction by the electrically conductive layer 6 and also by the second metal layer 4. The molding 10 delimits the component 100 in the lateral direction, with the second metal layer 4 being enclosed laterally over its full perimeter by the molding 10.

Figure 3:
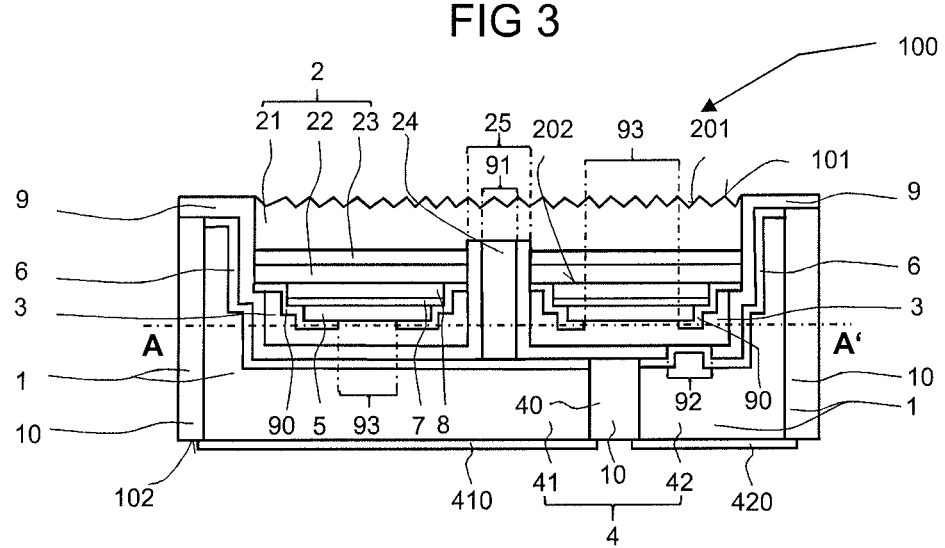
FIG. 3 shows a schematic illustration of a further embodiment for a component.

FIG. 3 schematically shows a further embodiment for a component 100. This embodiment corresponds substantially to the embodiment shown in FIG. 1. In contrast thereto, the entire semiconductor body 2 including the first semiconductor layer 21 is delimited in the lateral direction by the insulating layer 9. In this case, the entire semiconductor body 2 is laterally enclosed by the insulating layer 9 and/or by the molding 10. In the vertical direction, the insulating layer 9 ends flush in particular with the semiconductor body 2. The first metal layer 3 and the second metal layer 4 together can completely cover the entire semiconductor body 2.

By using a metal layer on a reverse side of the component which has a first subregion and a second subregion spaced apart laterally from the first subregion by an intermediate space, the component can be mechanically stabilized and at the same time can be externally electrically contacted via the subregions. Through the formation of a further metal layer, which bridges the intermediate space, and an electrically conductive layer of suitable configuration arranged between the metal layers, it is possible for the component to be designed in a manner devoid of mechanical weak points and devoid of a complex redistribution wiring plane arranged between a semiconductor body and a carrier of the component.

The present disclosure is not limited to the embodiments by the description of the present disclosure on the basis thereof. Rather, the present disclosure encompasses any new feature and also any combination of features, in particular including any combination of features in the patent claims, even if said feature or said combination itself is not explicitly indicated in the patent claims or embodiments.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A component comprising a semiconductor body, a first metal layer and a second metal layer, wherein
the first metal layer is arranged between the semiconductor body and the second metal layer, wherein the first metal layer has a continuous form,
a passivation layer formed on a side of the first metal layer facing away from the second metal layer, wherein the first metal layer extends through a through-hole of the passivation layer,
the semiconductor body has a first semiconductor layer on a side which is averted from the first metal layer, a second semiconductor layer on a side facing towards the first metal layer, and an active layer arranged between the first semiconductor layer and the second semiconductor layer,
the component has a plated-through hole, which extends through the second semiconductor layer and the active layer for the electrical contacting of the first semiconductor layer, and wherein the first metal layer has an opening through which the plated-through hole extends in the vertical direction,
the second metal layer has a first subregion, and a second subregion, spaced apart laterally from the first subregion by an intermediate space, wherein the first subregion is electrically connected to the plated-through hole and is assigned to a first electrical polarity of the component, and
in plan view, the first metal layer laterally completely bridges the intermediate space and is assigned to a second electrical polarity of the component which differs from the first electrical polarity,
and wherein the second metal layer is laterally delimited by a molding,
the laterally spaced-apart subregions of the second metal layer are held together by the molding,
and the molding, with the second metal layer, forms a carrier of the component.

2. The component as claimed in claim 1,
in which the first metal layer is configured as a mechanically stabilizing layer of the component.

3. The component as claimed in claim 1,
wherein the first metal layer has a thickness of between 5 µm and 50 µm inclusive.

4. The component as claimed in claim 1,
in which the first metal layer and the first subregion together cover at least 90% of the total surface area of the active layer.

5. The component as claimed in claim 1,
in which the first metal layer and/or the second metal layer comprise a first metal and at least one further material, wherein a proportion of the first metal is at least 90 atomic percent of the first or the second metal layer.

6. The component as claimed in claim 1,
in which the first metal layer has a higher modulus of elasticity than the second metal layer and/or the second metal layer has a higher thermal conductivity than the first metal layer.

7. The component as claimed in claim 1,
in which an electrically conductive layer is arranged between the first metal layer and the second metal layer, wherein
the electrically conductive layer has a first sublayer, and a second sublayer, spaced apart laterally from the first sublayer,
the first sublayer is electrically connected to the first subregion, and the second sublayer is electrically connected to the second subregion.

8. The component as claimed in claim 7,
in which the second metal layer adjoins the electrically conductive layer and the first subregion is electrically connected to the plated-through hole via the first sublayer.

9. The component as claimed in claim 7,
in which the electrically conductive layer contains a metal and is formed as a mirror layer.

10. The component as claimed in claim 1,
in which the second semiconductor layer is electrically connected to the second subregion of the second metal layer via the first metal layer, and the second subregion is assigned to the second electrical polarity of the component.

11. The component as claimed in claim 1,
wherein the component is configured so as to be electrically contactable via the first subregion and the second subregion on a side of the second metal layer which is averted from the first metal layer.

12. The component as claimed in claim 1,
in which the active layer, during the operation of the component, emits electromagnetic radiation in the visible, ultraviolet or infrared spectral range.

13. The component as claimed in claim 1,
which is devoid of a growth substrate.

14. A method for producing a component wherein the component comprises a semiconductor body, a first metal layer and a second metal layer, wherein
the first metal layer is arranged between the semiconductor body and the second metal layer, wherein the first metal layer has a continuous form,
the component has a passivation layer formed on a side of the first metal layer facing away from the second metal layer, wherein the first metal layer extends through a through-hole of the passivation layer,
the semiconductor body has a first semiconductor layer on a side which is averted from the first metal layer, a second semiconductor layer on a side facing towards the first metal layer, and an active layer arranged between the first semiconductor layer and the second semiconductor layer,
the component has a plated-through hole, which extends through the second semiconductor layer and the active layer for the electrical contacting of the first semiconductor layer, wherein the first metal layer has an opening through which the plated-through hole extends in the vertical direction,
the second metal layer has a first subregion, and a second subregion, spaced apart laterally from the first subregion by an intermediate space, wherein the first subregion is electrically connected to the plated-through hole and is assigned to a first electrical polarity of the component, and
in plan view, the first metal layer laterally completely bridges the intermediate space and is assigned to a second electrical polarity of the component which differs from the first electrical polarity,
and wherein the second metal layer is laterally delimited by a molding,
the laterally spaced-apart subregions of the second metal layer are held together by the molding,
and the molding, with the second metal layer, forms a carrier of the component, in which the semiconductor body is provided, wherein an electrically conductive layer is formed on a side of the first metal layer which is averted from the semiconductor body, such that the electrically conductive layer is electrically connected to the plated-through hole in certain regions, and the second metal layer is galvanically applied to the electrically conductive layer.

15. The method as claimed in claim 14, in which the first metal layer is galvanically applied to the semiconductor body prior to the application of the electrically conductive layer.

16. The component as claimed in claim 1, wherein the first subregion and the second subregion are embedded in the molding.

17. A component having a semiconductor body, a first metal layer and a second metal layer, wherein the first metal layer is arranged between the semiconductor body and the second metal layer, a passivation layer formed on a side of the first metal layer facing away from the second metal layer, wherein the first metal layer extends through a through-hole of the passivation layer, the semiconductor body has a first semiconductor layer on a side which is averted from the first metal layer, a second semiconductor layer on a side facing towards the first metal layer, and an active layer arranged between the first semiconductor layer and the second semiconductor layer, the component has a plated-through hole, which extends through the second semiconductor layer and the active layer for the electrical contacting of the first semiconductor layer, wherein the first metal layer has an opening through which the plated-through hole extends in the vertical direction, the second metal layer has a first subregion, and a second subregion, spaced apart laterally from the first subregion by an intermediate space, wherein the first subregion is electrically connected to the plated-through hole and is assigned to a first electrical polarity of the component, and in plan view, the first metal layer laterally completely bridges the intermediate space and is assigned to a second electrical polarity of the component which differs from the first electrical polarity, in which the first metal layer is configured as a continuous, mechanically stabilizing, preferably self-supporting, layer of the component and/or wherein the active layer or the entire semiconductor body has no point which is not mechanically supported by the first metal layer or by the second metal layer.

18. The component as claimed in claim 8, in which the electrically conductive layer contains a metal and is formed as a mirror layer.

19. The component as claimed in claim 1, wherein an insulating layer and the passivation layer substantially encapsulate the first metal layer, the insulating layer disposed at least on side of the first metal layer facing the second metal layer.

* * * * *